United States Patent [19]

Dartois et al.

[11] Patent Number: 5,267,273
[45] Date of Patent: Nov. 30, 1993

[54] CLOCK SIGNAL GENERATOR USING FRACTIONAL FREQUENCY DIVISION AND CONTROL THEREOF

[75] Inventors: Luc Dartois, Carrieres S/Poissy, France; Peter Reusens, Laarne; Etienne Vanzieleghen, Anvers, both of Belgium

[73] Assignee: Alcatel Radiotelephone, Paris, France

[21] Appl. No.: 750,171

[22] Filed: Aug. 26, 1991

[30] Foreign Application Priority Data

Aug. 24, 1990 [FR] France .................. 90 10616

[51] Int. Cl.⁵ ............................................. H04L 7/00
[52] U.S. Cl. ..................... 375/106; 377/48; 377/50; 377/51
[58] Field of Search ............ 375/106, 110; 328/15, 328/30; 377/47–50, 51–54

[56] References Cited

U.S. PATENT DOCUMENTS

| | | | |
|---|---|---|---|
| 4,228,403 | 10/1980 | Okumura et al. | 328/15 |
| 4,555,793 | 11/1985 | Benamy | 377/49 |
| 4,658,406 | 4/1987 | Pappas | 377/49 |
| 4,712,224 | 12/1987 | Nelson | 377/47 |
| 4,914,680 | 4/1990 | Tanns et al. | 377/49 |
| 4,991,187 | 2/1991 | Herold et al. | 377/48 |
| 4,996,699 | 2/1991 | Rudolph | 377/49 |

FOREIGN PATENT DOCUMENTS

| | | | |
|---|---|---|---|
| 0019412 | 5/1980 | European Pat. Off. | |
| 0079420 | 4/1988 | Japan | 328/30 |

Primary Examiner—Curtis Kuntz
Assistant Examiner—Don N. Vo
Attorney, Agent, or Firm—Sughrue, Mion, Zinn, Macpeak & Seas

[57] ABSTRACT

A clock signal generator using fractional frequency division is provided comprising a division circuit that produces a clock signal starting from a timing rhythm signal. The frequencies of the two signals are in a division ratio which is the sum of a whole part and a fractional part. A pulse subtractor is provided for receiving the rhythm signal and transmitting it to the division circuit while deleting at least one pulse from this signal upon a command. An accumulator commands a pulse subtractor on each occasion when the product of the number of pulses of the clock signal counted, starting from a time of origin and of the fractional part, changes by unity.

15 Claims, 2 Drawing Sheets

CLOCK SIGNAL GENERATOR USING FRACTIONAL FREQUENCY DIVISION AND CONTROL THEREOF

BACKGROUND OF THE INVENTION

The present invention relates to a clock signal generator using fractional division of frequency and to means for keeping said clock signal generator under the control of a synchronization signal.

The majority of electronic circuits are now designed to operate using a determined frequency clock signal produced by an oscillator. When a piece of equipment includes circuits that are designed to operate on different clock signals, a first solution consists in using a specific oscillator circuit for each clock signal. This solution is clearly not an economical way of solving the problem. Use is often made, when the frequency of a first clock signal is not a multiple of the frequency of a second one, of a clock signal generator employing fractional division of its frequency. Such a clock signal generator, when it is fully implemented in digital technology produces a signal the average frequency of which over one full period is the frequency of the signal it is receiving divided by a division ratio.

The use is known of a programmable counter receiving a signal at a steady rhythm and adapted to periodically output, depending on the period of recurrency, a successive first and second series of pulses the frequencies of repetition of which are submultiples of the frequency of the steady rhythm signal. Such a device, apart from the programmable counter, requires two additional counters in order to determine the number of pulses in each series, together with control means. It hence occupies, where it is implemented in integrated form, a fairly large substrate surface area which is an obstacle to the miniaturization of the equipment in which it is incorporated.

European Patent 0 019 412 disclosed the use of a counter that is preceded by a pulse absorber or subtractor for fulfilling the function of a programmable counter. The pulse subtractor in effect eliminates pulses from the rhythm signal when commanded so to do thus modifying the frequency of the output signal from the counter.

Nevertheless, the phase shift between the output signal and a signal the frequency of which is exactly at the division ratio of the rhythm signal frequency is highly variable and can have an appreciable amplitude.

A first object of the present invention is to provide a clock signal generator using fractional division of frequency of reduced size made possible by the use of individual circuits that are more simple and the output signal of which only suffers from limited phase shifting relative to the desired frequency. This phase shift, in a preferred embodiment, is less than one period of the steady rhythm signal.

In certain fields of application, particularly in telecommunications systems receiving equipment, it is necessary to set the output signal from the clock signal generator under the control of a synchronization signal.

The present invention hence also has the object of providing control means that are specially suitable for this type of clock signal generator using fractional division of frequency.

Although one should not attempt to see a limitation of the invention in this, the provisions of the invention can advantageously be used in the Pan-European digital cellular radiocommunications system. In this system, a mobile terminal comprises a speech coding and decoding unit which can be implemented using a standard component working with 8 kHz and 2048 kHz clock signals. The terminal further includes an internal clock signal generator producing a 13 MHz steady rhythm signal, and produces a 50 Hz synchronization signal onto which the coding and decoding units require to be synchronized. The invention hence makes it possible, starting from this steady rhythm signal, to produce clock signals that are synchronized onto this synchronization signal.

SUMMARY OF THE INVENTION

The invention provides a clock signal generator using fractional frequency division comprising a division circuit that produces a clock signal starting from a timing rhythm signal, the frequencies of the two said signals being in a division ratio which is the sum of a whole part and a fractional part, the generator including a pulse subtractor receiving said rhythm signal and transmitting it to said division circuit while deleting at least one pulse from said signal upon a command, and accumulator means for commanding said pulse subtractor on each occasion when the product of the number of pulses of the clock signal counted starting from a time of origin and of said fractional part changes by unity.

The phase shift between the clock signal generator signal and the steady rhythm signal is thus minimized. Moreover, in the clock signal generator using fractional division of frequency, with the division ratio taking the form of the sum of the product of a first division factor and of the fractional part and of the product of a second division factor and the ones-complement of said fractional part, the accumulator means include an accumulation register producing a first operand which adopts the value of an addition signal in response to said clock signal, and an addition circuit producing said addition signal as the sum modulo the denominator of said fractional part of said first operand and of a second operand comprising at least the numerator of said fractional part and producing a carry-over signal, the pulse subtractor being adapted to absorb a number of pulses equal to the difference between said two division factors in response to this carry-over signal.

Moreover, with the clock signal generator adapted to be controlled by a synchronization signal, it includes a closed loop feedback control module receiving said synchronization signal and said clock signal and producing a correction signal, the abovesaid second operand being the sum of said numerator and said correction signal.

Thus, with the frequency of the clock signal being a multiple of the frequency of the synchronization signal, the control module includes means for producing a counting value corresponding to the number of pulses of said clock signal that have appeared during a fixed duration measurement period, means for producing a correction value that is proportional to the difference of a second and a first counting value and inversely proportional to the duration separating the mid-point of the second and the first corresponding measuring periods, said correction signal which usually is zero, being assigned said correction value during a correction period that is expressed as a number of periods of the clock signal.

Moreover, in the clock signal generator using fractional frequency division with the measurement period being a multiple of the period of the synchronization signal, and the first and second corresponding measuring periods being consecutive, the control module includes a counter receiving said clock signal and producing a phase signal, the capacity of this counter being a sub-multiple of the frequency ratio of said clock signal and said synchronization signal, and includes a summing circuit producing said second counting value as the sum of the values adopted by said phase signal at the rhythm of said synchronization signal, a time-delay register producing said first counting value in the same way as said second counting value with a delay of said measurement period, a subtraction circuit producing a phase deviation signal as the difference of said second and first counting values, and a correction module producing said correction value in proportion to the phase deviation signal.

Advantageously in the clock signal generator using fractional division of frequency, an individual output from said counter is employed for producing an auxiliary clock signal.

In one embodiment, the clock signal generator using fractional frequency division further includes a compensation circuit for immediately producing this correction value as the sum of the values of the output signal of said correction module during the previous measuring period and the current measuring period.

Moreover in the clock signal generator using fractional division of frequency, the compensation circuit includes a saturation adder limiting said correction value to a determined maximum value.

In one particular embodiment, the generator includes a limiting circuit that affects this correction signal for the correction value during the first appearance of a determined state on an individual output of said counter subsequent to the start of a period of said synchronization signal, said correction signal being zero during the remainder of this period.

Moreover, it can include a synchronization register producing, as a measurement signal, this phase signal in response to a triggering signal originating from a triggering circuit the output of which adopts the value of said synchronization signal upon command from the clock signal, said measurement signal being addressed to the summing circuit.

According to one further feature, the generator can include a command circuit producing a command signal the period of which is equal to the measurement period, said command signal resetting said summing circuit, transferring the input to the output of said time-delay register and modifying the output signal from the compensating circuit. Advantageously, the clock signal generator using fractional frequency division receives an initialization signal adapted to initialize the compensation circuit.

Moreover, the generator can include an initialization circuit which imposes a starting value on the counter in response to the initialization signal.

In one particular case of the clock signal generator using fractional division of frequency, the whole number part of the division ratio is zero.

It is also possible to make provision so that the difference in the two division factors is equal to unity, the pulse subtractor deleting one single pulse upon command.

The various objects and features of the present invention will become more clear from the description of several embodiments provided by way of non-limiting examples with reference to the attached drawings.

DETAILED DESCRIPTION OF PREFERRED EMBODIMENTS

Clock signal generators using fractional division of frequency receive a steady rhythm signal and produce a clock signal and are adapted so that the frequencies of these signals are in a division ratio equal to Q. This ratio can always be expressed as the sum of the product of a first division factor A and of a fractional part F and of the product of a second division factor B and the ones-complement of this fractional part, where the division factors are whole numbers and the fractional part is a number comprised between zero and one:

$$Q = A.F + B.(1-F)$$

The various numbers can moreover be chosen so that the difference between the two division factors is equal to unity:

$$A = B + 1$$

Moreover, the fractional part can be represented in the form of a fraction comprising a numerator N and a denominator D:

$$F = N/D$$

The invention described below is valid regardless of the value of these various numbers.

By way of example, and in order to clarify the description, the invention will be explained with regard to a concrete case of its application in the Pan-European digital cellular radiocommunications system. In this case, a mobile terminal is fitted with an internal oscillator which produces the rhythm signal at a frequency of 13 MHz. Starting from this signal, it is necessary to produce the clock signal which is notably made use of by the speech processing circuits, at a frequency of 2.048 MHz. The division ratio is hence:

$$\begin{aligned} Q &= 6.34765625 \\ Q &= 6 + 89/256 \\ &= 6\frac{(256-89)}{256} + 7 \cdot \frac{(89)}{256} \end{aligned}$$

By using the notation discussed above:

$$A = 7 \quad B = 6 \quad F = \frac{89}{256}$$
$$N = 89 \quad D = 256$$

Figure 1:
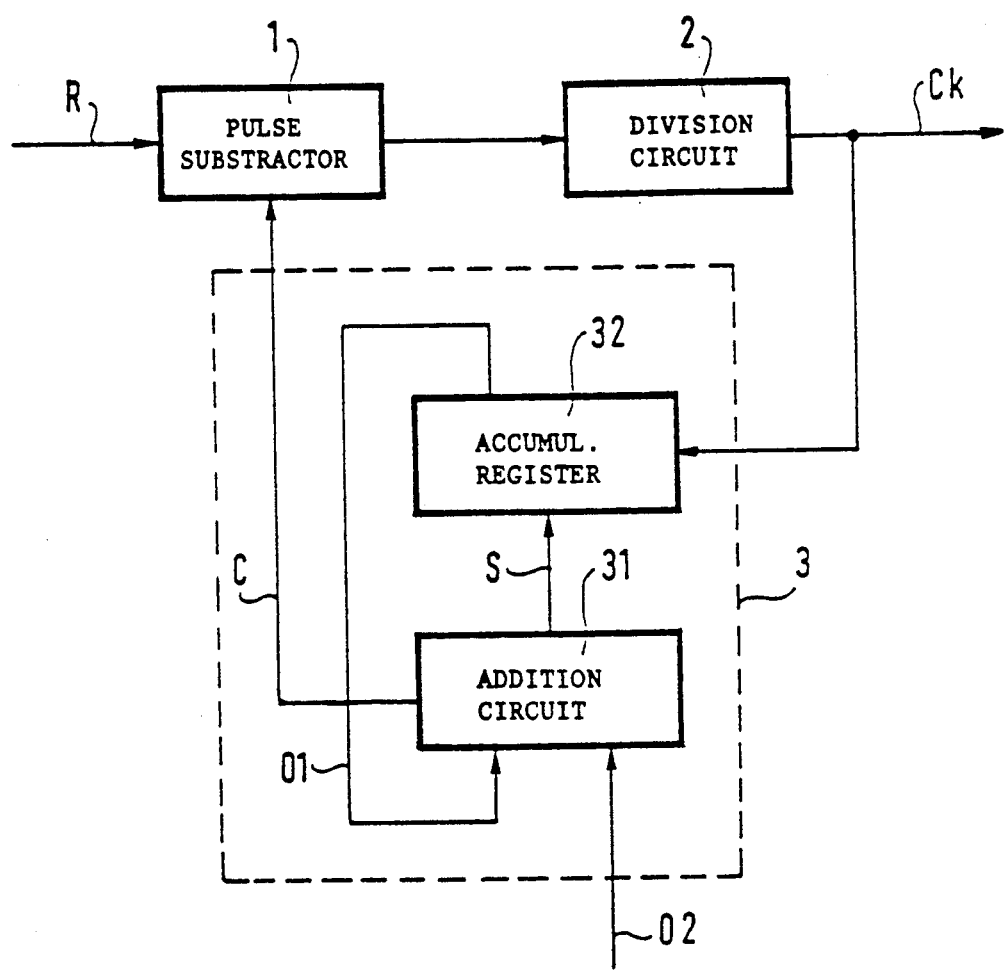
FIG. 1 is a block diagram of a clock signal generator using fractional division of frequency according to the invention.

The clock signal generator using fractional division of frequency according to the invention and illustrated in FIG. 1 comprises a pulse absorber or subtractor 1 which receives the rhythm signal R and the output of which is connected to the input of a division circuit 2 which produces the clock signal Ck. It also includes accumulation means 3 which receive this clock signal and control the pulse subtractor by means of a carry-over signal C, these means being provided for limiting the phase shift in the clock signal as will become more clear below.

The pulse subtractor 1 transmits the steady rhythm signal R directly to its output except when it receives the carry-over signal C. In this latter case, it deletes one pulse from the steady rhythm signal. The division circuit 2 produces the clock signal Ck the frequency of which is a sub-multiple of the frequency of the signal that is applied to its input. This sub-multiple is equal to the second division factor B which in the present case is 6. This circuit can be a counter for example, and when it is dividing by an even number this can advantageously be a ring counter also known as a Johnson counter. A counter of this type takes the form of a series of a flip-flops the first of which receives the output signal from the last which is the clock signal Ck. The sub-multiple is here twice the number of flip-flops.

Accumulation means 3 are provided for triggering the pulse subtractor 1 each time that the product of the fractional part F and of a number of clock signal pulses counted starting from an origin point in time changes by unity, in other words when the whole number part increases by a unity value. The point in time of the origin is arbitrarily fixed and only constitutes a time reference. It can for example be the time when the clock signal generator was first started.

These accumulation means 3, in one particular embodiment which should not be considered as limiting the invention, comprise an addition circuit 31 and an accumulation register 32.

The accumulation register 32 produces a first operand $O_1$ which has the value that the addition signal S had when the most recent pulse in clock signal Ck occurred.

Addition circuit 31 produces this addition signal S as the sum of the first operand and of a second operand $O_2$ modulo the denominator D of the fractional part F. The second operand, in this first part of the invention, adopts the value of the numerator N of this fractional part F. This circuit is moreover designed to supply the carry-over signal C for the pulse subtractor 1, when this sum is greater than the denominator.

Thus, every time that the product of the numerator and of the number of pulses in the clock signal becomes greater than a multiple of the denominator, and below which value it previously was, one clock signal pulse is deleted which comes down to carrying out division by the first division factor A.

In the numerical example being considered, the denominator is equal 256. The addition circuit can hence consist of a single adder supplying an output signal on 8 bits and a carry-over signal.

The invention applies if the division ratio is reduced to the fractional part, in other words if the first and second division factor, A and B respectively, are respectively 1 and 0. In this case, the division circuit 2 is reduced to a simple link, the clock signal Ck being the output signal from the pulse subtractor 1.

The invention also applies if the division factors differ by more than unity. Here, it is sufficient to adapt the pulse subtractor 1 to delete a number of pulses that is equal to the difference between these two factors. This operation which is within the abilities of those skilled in the art, will not be described in more detail.

According to one further feature of the invention, the clock signal generator using fractional divisional frequency is designed to be kept under the control of a synchronization signal via a control module, the frequency of this synchronization signal being a sub-multiple of the frequency of the clock signal.

This control module is adapted to register the number of pulses in the clock signal Ck during a fixed value measurement period. It produces a first counting value during a first measurement period, and then a second counting value during a second measurement period. It then calculates a correction value that is proportional to the difference between these two counting values and inversely proportional to the duration of the time that separates the mid-points of the two corresponding measurement periods. It finally produces a correction signal which adopts this correction value during a correction period and which for the rest of the time is zero. This correction signal is added to the numerator N of the fractional part F in order to form the second operand $O_2$ of addition circuit 31.

Figure 2:
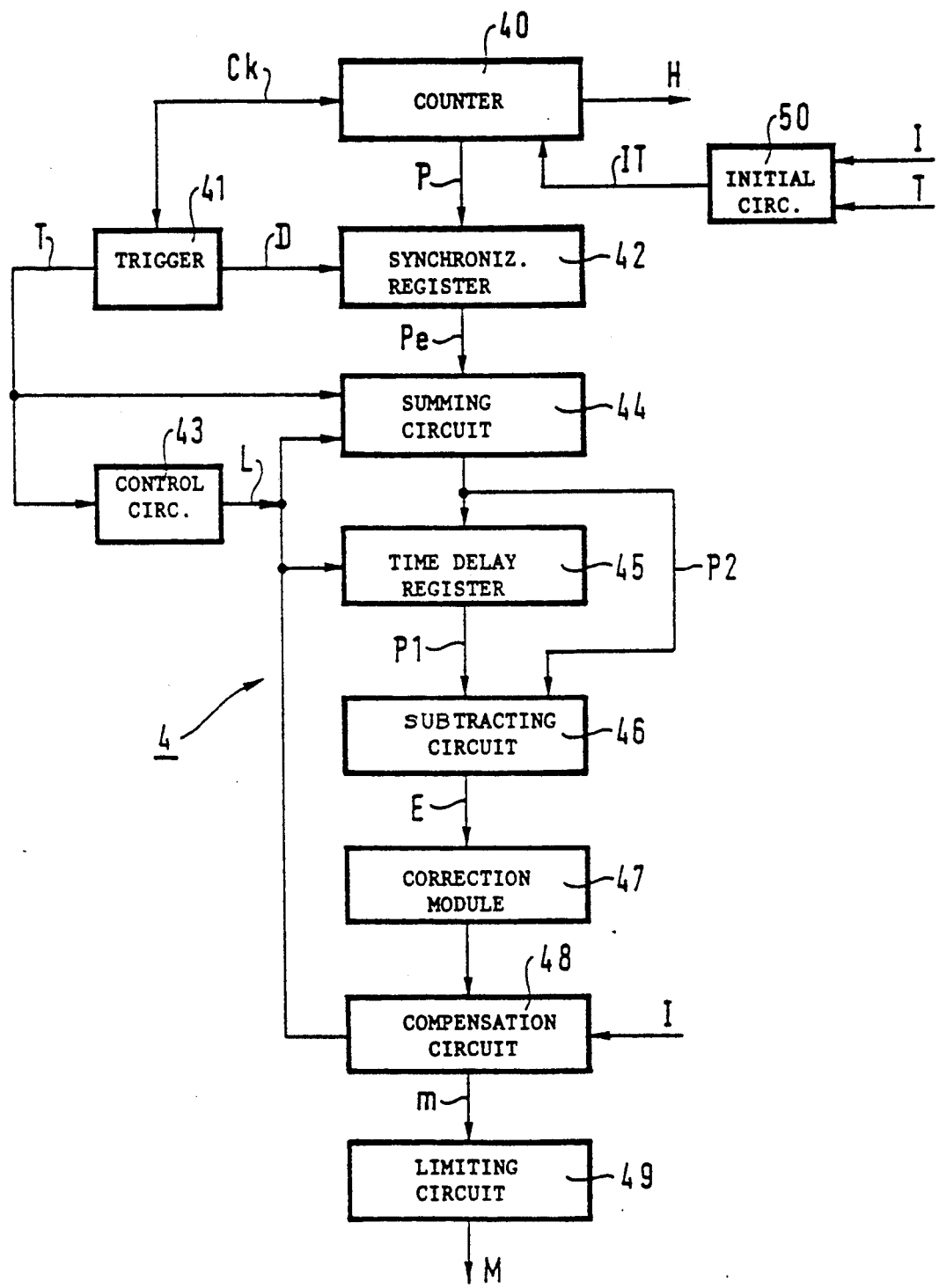
FIG. 2 is the schematic of a control module for the clock signal generator.

This control module 4 appears in an embodiment that is provided solely for indicative purposes in FIG. 2. It includes several units which will now be described in detail.

A counter 40 receives the clock signal Ck and produces a phase signal P which corresponds to the number of pulses that have appeared since it was reset. The capacity of this counter is a sub-multiple of the frequency ratio between clock signal Ck and synchronization signal T. A trigger circuit 41 produces a trigger signal D that adopts the value that synchronization signal T had at the time the second pulse of clock signal Ck appeared. This can for example be a flip-flop of the type known as a D-type flip-flop.

A synchronization register 42 produces a measurement signal Pe the value of which is the value that phase signal P had at the moment the last pulse of trigger signal D appeared.

A control circuit 43 produces a periodic command signal L the value of which is equal to the measurement period. Advantageously, this measurement period is a multiple of the synchronization signal period.

A summing circuit 44 supplies the second counting value $P_2$ which is the sum of the values adopted by measurement signal Pe at the time of each pulse of synchronization signal T. This circuit is reset by command signal L. It can now be seen more clearly why the output signal from this circuit is the second counting value.

A time delay register 45 produces the first counting value $P_1$ as the second counting value delayed by one measurement period, in other words one period of command signal L. This hence justifies its name since at any given instant, the output signal from this register has the value that the output signal from summing circuit 44 had during the preceding measurement period.

A subtracting circuit 46 produces a phase deviation or shift signal E as the difference between the two counting values: $P_2 - P_1$.

A correction module 47 produces an output signal the value of which is equal to the value of phase deviation signal E divided by the ratio between the measurement period and the period of synchronization signal T, multiplied by a constant which is often referred to as the stiffness coefficient of closed-loop control.

A compensation circuit 48 produces a correction value m which is the sum of the values of the output signal from correction module 47 during the preceding measurement period and during the current period. This circuit is designed to limit the correction value to a maximum value. It for example comprises a saturation adder which produces either the sum of the two values or the said maximum value if the actual sum is higher. This circuit is also designed to be initialized by an initializing signal I.

A limiting circuit 49 produces the correction signal M having the correction value m during a correction period, it being zero for the rest of the time. This correction period can have any value whatsoever and will be determined by the person skilled in the art.

This correction signal M is added by means of an adding circuit not shown in the figure, to the numerator N of the fractional part F in order to provide the second operand $O_2$.

Finally, as an accessory provision, counter 40 is adapted to be initialized to a starting value $I_T$ by means of an initializing circuit 50 commanded by initializing signal I upon the appearance of synchronization signal T.

In one embodiment of the clock signal generator, the counter 40 is moreover adapted to supply an auxiliary clock signal H at the output of one of its counting cells. This auxiliary clock signal is synchronized with the clock signal and just like the latter, is under the control of synchronization signal T.

This variant can be advantageously applied in the case of the mobile terminal referred to previously. In fact, certain components designed for speech processing operate with a 2.048 MHz signal and a 8 kHz signal which is the speech sampling frequency. Moreover, the signals need to be slaved to the 50 Hz synchronizing signal produced by the terminal and which corresponds to the communication frame rate.

In this case, the capacity of counter 40 will be chosen to be equal to 256, the most significant bits corresponding to auxiliary clock signal H at a frequency of 8 kHz.

It will be noted that the counting values $P_1$, $P_2$ in this case are not equal to the number of pulses in clock signal Ck produced during the corresponding measurement period, because counter 40 will have gone through several cycles (160 in this case) during a synchronization signal period. These counting values correspond, however, to the numbers of pulses since they are congruous therewith (modulo 256 in this case). Given the low frequency deviation that exists between the clock signal when it is being slaved and when it is not, the counter capacity is sufficient. If this were not the case, it would always be possible to increase the capacity of this counter in order to widen the possible range of correction, its capacity being limited to the ratio between the frequencies of the clock signal generator signals and of the synchronization signal.

One advantageous solution consists in designing limiting circuit 49 in such a way that the correction period is the period of auxiliary clock signal H. The correction signal is assigned the correction value during this period and is zero over the remainder of the period of synchronization signal T. This operation is periodically repeated at the synchronization signal rate, for example.

In this case, if closed loop control requires to make it possible to obtain a relative frequency deviation between the auxiliary clock signal and the synchronization signal that is less than 5 parts per million, the correction value could take one of the values $-2, -1, 0, 1$ or 2.

In effect, during a synchronization period for which the correction value is 2, during one period of the auxiliary clock signal, the division ratio is equal to $Qc = 6 + 91/256$, while over the other 159 periods, it is equal to $Qo = 6 + 89/256$. The frequency deviation is hence equal to:

$$\frac{Qc - Qo}{160\, Qo} = 7.68 \cdot 10^{-6}$$

The second operand $O_2$ which is the sum of the correction value and of the numerator will hence be a whole number comprised between 87 and 91. The adder which produces this second operand can be reduced to a simple combination logic circuit which produces the 4 least significant bits of this operand, its 3 most significant bits being invariable. In effect, the 5 decimal values that this operator can adopt are expressed as follows in binary notation:

$$87 = 101\ 0111$$
$$88 = 101\ 1000$$
$$89 = 101\ 1001$$
$$90 = 101\ 1010$$
$$91 = 101\ 1011$$

Moreover, it will be noted that the carry-over signal C from addition circuit 31 is periodic. Its period corresponds to 256 pulses of clock signal Ck. The result is that the auxiliary clock signal which has the same period presents the special feature that all of its pulses have the same phase shift or deviation since they are separated by the same number of periods of the regular rhythm signal R. Thus, when the auxiliary clock signal is employed as a sampling signal, it does not introduce spurious modulation into the signal being sampled.

A further advantage of the invention resides in the fact that the distribution in time between divisions by the first factor A and the second factor B is as uniform as possible. In the numerical example selected (A = 7, B = 6), the maximum phase deviation, also called phase jitter, between clock signal Ck and the regular rhythm signal is equal to one period of this rhythm signal, in other words 76.9 ns.

The embodiment of a closed-loop control module that has just been described has a very comprehensive structure which provides the required performance. The invention also applies if certain components are deleted.

In effect, trigger circuit 41 is not strictly necessary, its role being limited to synchronizing synchronization register 42 onto clock signal Ck. It can be eliminated by directly controlling this register with synchronization signal T in the place of trigger signal D.

It is also not indispensable to take counting values $P_1$, $P_2$ over several periods of synchronization signal T, although this does increase the accuracy of closed-loop control. In this case, the control circuit 43 has no more purpose and nor has summing circuit 44. The second counting value $P_2$ is equal to the measurement signal $P_1$ which is directly applied to the input of time delay register 45 instead of the output signal from summing circuit 44. This synchronization register is commanded by synchronization signal T instead of command signal L, and this also applies to compensating circuit 48.

Moreover, this compensating circuit can also be deleted, the output from correction module 47 being directly linked to the input of limiting circuit 49.

What is claimed is:

1. The clock signal generator using fractional frequency division comprising a division circuit that produces a clock signal starting from a timing rhythm signal, wherein frequencies of said clock and timing rhythm signals are in a division ratio which is a sum of a whole part and a fractional part, said generator including a pulse subtractor for receiving said rhythm signal and for transmitting it to said division circuit while deleting at least one pulse from said rhythm signal upon a command, accumulator means, connected to said division circuit, for commanding said pulse subtractor on each occasion when a product of a number of pulses of said clock signal and of said fractional part changes by unity, and means for determining said product and for counting said number of pulses starting at a time of origin.

2. The clock signal generator using fractional frequency division according to claim 1, wherein with said division ratio forms a sum of a first product of a first division factor and of said fractional part and of a second product of a second division factor and an ones-complement of said fractional part, said accumulator means include an accumulation register producing a first operand which adopts a value of an addition signal in response to said clock signal, and an addition circuit producing said addition signal as a sum modulo a denominator of said fractional part of said first operand and of a second operand comprising at least a numerator of said fractional part and producing a carry-out signal, said pulse subtractor being adapted to absorb a number of pulses equal to a difference between said two division factors in response to this carry-over signal.

3. The clock signal generator using fractional frequency division according to claim 2, wherein with said clock signal generator adapted to be controlled by a synchronization signal, it includes a closed loop feedback control module receiving said synchronization signal and said clock signal and producing a correction signal, said second operand being a sum of said numerator and said correction signal.

4. The clock signal generator using fractional frequency division according to claim 3, wherein the frequency of said clock signal is a multiple of the frequency of said synchronization signal and wherein said control module includes:

means, connected to said division circuit, for producing a counting value corresponding to the number of pulses of said clock signal that have appeared during a fixed duration measurement period, means for receiving said clock signal and for producing a correction value, which is proportional to a difference between second and first counting values and inversely proportional to a duration separating mid-points of second and first corresponding measuring periods, said correction signal which usually is zero, being assigned the correction value during a correction period that is expressed as a number of periods of said clock signal, said control module calculating said difference and said duration separating said mid-points.

5. The clock signal generator using fractional frequency division according to claim 4, wherein a measurement period is a multiple of the period of said synchronization signal, said first and second corresponding measuring periods being consecutive, said control module including:

a counter for receiving said clock signal and for producing a phase signal, a capacity of said counter being a sub-multiple of a frequency ratio of said clock signal and said synchronization signal, a summing circuit for producing said first and second counting values as sums of values adopted by said phase signal at a rhythm of said synchronization signal, a time-delay register for delaying and producing said first counting value at a same time as said summing circuit outputs said second counting value after a delay equaling said measurement period, a subtraction circuit producing a phase deviation signal as the difference of said second and first counting values, and a correction module producing said correction value in proportion to said phase deviation signal.

6. The clock signal generator using fractional frequency division according to claim 5, wherein an individual output from said counter is employed for producing an auxiliary clock signal.

7. The clock signal generator using fractional frequency division according to claim 5, further including a compensation circuit for immediately producing said correction value as a sum of values of an output signal of said correction module during a previous measuring period and a current measuring period.

8. The clock signal generator using fractional frequency division according to claim 7, wherein said compensation circuit includes a saturation adder limiting said correction value to a predetermined maximum value.

9. The clock signal generator using fractional frequency division according to claim 5, further including a limiting circuit that affects said correction signal for said correction value during a first appearance of a predetermined state on an individual output of said counter subsequent to a start for a period of said synchronization signal, said correction signal being zero during a remainder of said period.

10. The clock signal generator using fractional frequency division according to claim 5, wherein said control module further includes a synchronization register for receiving said phase signal from said counter and for producing a measurement signal based on said phase signal in response to a triggering single originating from a triggering circuit, an output of which adopts the value of said synchronization signal upon command from said clock signal, said measurement signal being addressed to said summing circuit.

11. The clock signal generator using fractional frequency division according to claim 10, wherein said control module further includes a command circuit for receiving the synchronization signal and for producing based thereon a command signal, a period of which is equal to said measurement period, said command signal resetting said summing circuit, transferring an input to an output of said time-delay register and modifying an output signal from said compensating circuit.

12. The clock signal generator using fractional frequency division according to claim 5, wherein it receives an initialization signal adapted to initialize said compensation circuit.

13. The clock signal generator using fractional frequency division according to claim 12, wherein it includes an initialization circuit which imposes a starting value on said counter in response to said initialization signal.

14. The clock signal generator using fractional division according to claim 1, wherein the whole number part of said division ratio is zero.

15. The clock signal generator using fractional frequency division according to claim 2, wherein the difference in the two division factors is equal to unity, said pulse subtractor deleting one single pulse upon command.

* * * * *